United States Patent [19]

Walker, Jr. et al.

[11] Patent Number: 4,466,120
[45] Date of Patent: Aug. 14, 1984

[54] TELEPHONE HANDSET AMPLIFIER CIRCUIT

[75] Inventors: Wesley F. Walker, Jr.; David Hanon, both of Catoosa County, Ga.

[73] Assignee: Walker Equipment Corporation, Ringgold, Ga.

[21] Appl. No.: 533,884

[22] Filed: Sep. 20, 1983

Related U.S. Application Data

[63] Continuation of Ser. No. 273,714, Jun. 15, 1981, abandoned.

[51] Int. Cl.³ .............................................. H04M 1/60
[52] U.S. Cl. .................................. 381/109; 179/81 B
[58] Field of Search .......................... 179/81 B, 81 R; 381/102, 104, 109, 120; 455/232, 233

[56] References Cited

U.S. PATENT DOCUMENTS

| | | | |
|---|---|---|---|
| 3,533,006 | 10/1970 | Kubicz | 330/29 |
| 3,691,298 | 9/1972 | Pittman et al. | 179/1 VL |
| 3,963,876 | 6/1976 | Holtz et al. | 179/81 B |
| 4,151,376 | 4/1979 | Walker, Jr. | 179/81 B |

Primary Examiner—A. D. Pellinen
Assistant Examiner—James L. Dwyer
Attorney, Agent, or Firm—Seidel, Gonda & Goldhammer

[57] ABSTRACT

A rocker switch is operated by the handset user to vary the impedance of a FET. The FET impedance varies in proportion to the duration of operation of the switch. The handset receiver "volume" increases or decreases in proportion to the FET impedance. An electret condensor microphone stabilizes the receiver supply voltage and provides improved transmitter linearity and low distortion.

14 Claims, 7 Drawing Figures

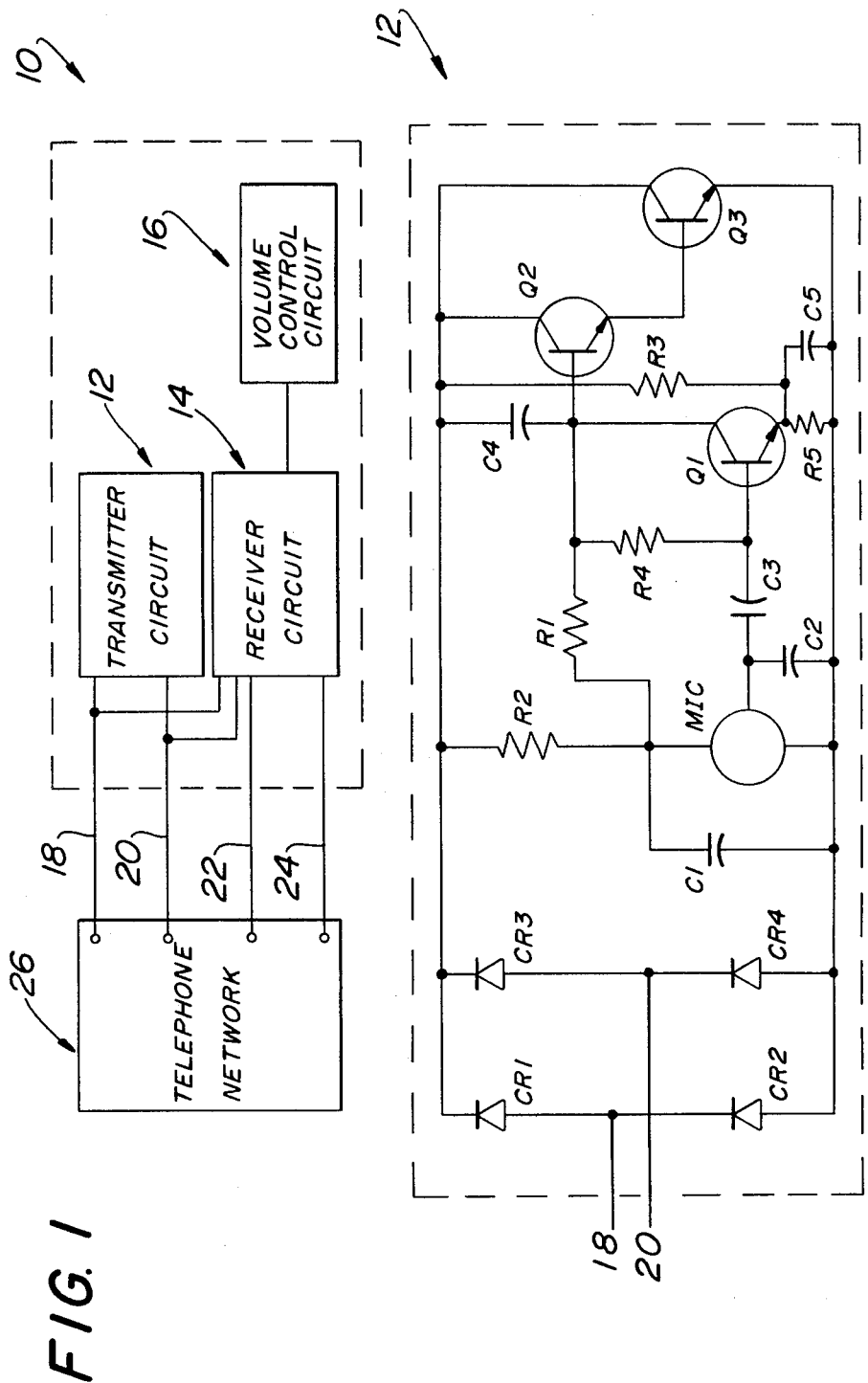

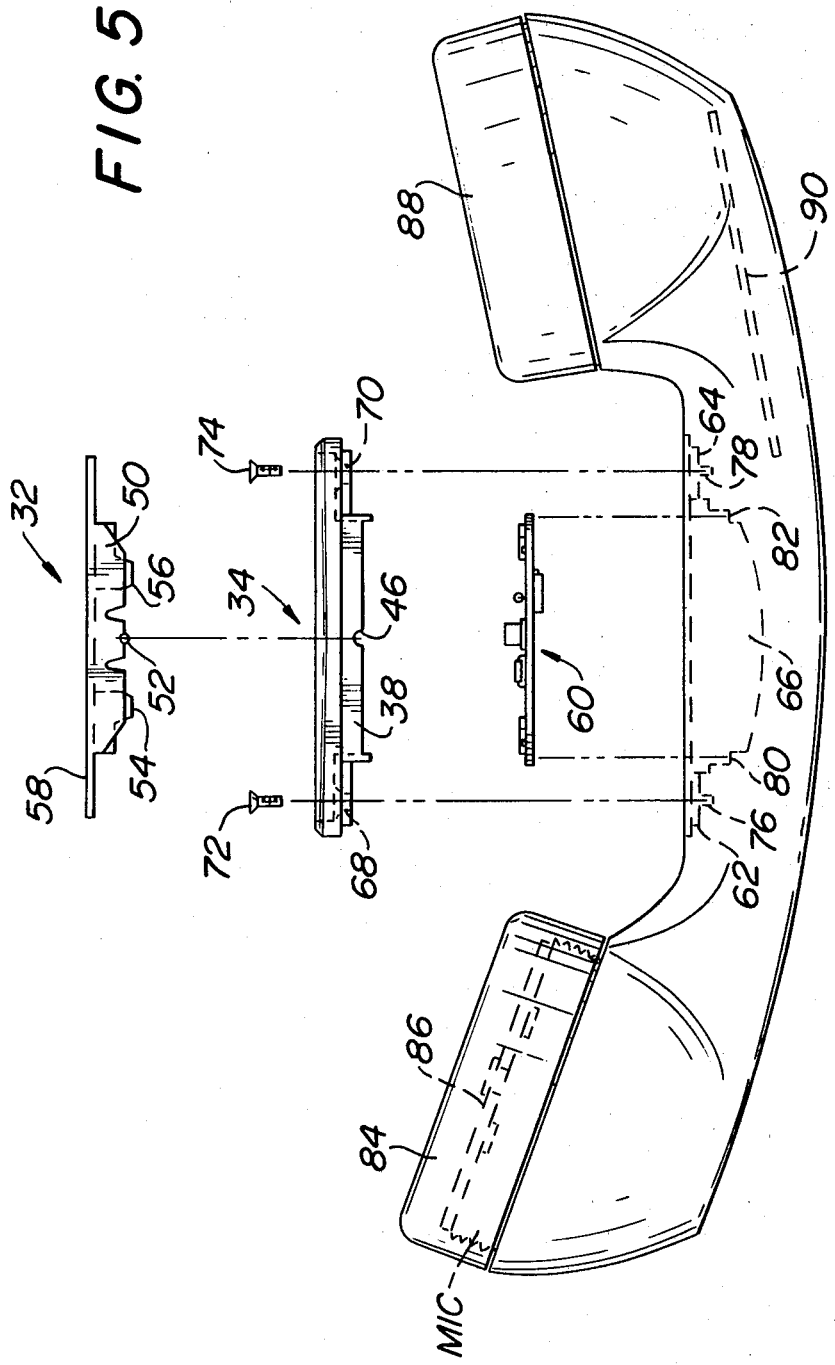

TELEPHONE HANDSET AMPLIFIER CIRCUIT

This is a continuation of Ser. No. 273,714, filed 6-15-81, now abandoned.

BACKGROUND OF THE INVENTION

The invention relates generally to telephone handsets containing receiver amplifiers for use by the hearing-impaired or for use in environments with high ambient noise levels.

Conventional telephone handsets have no means for varying the amplitude of the audio signal received from the telephone subset. Thus, the volume of the acoustic output of the receiver is not adjustable, and is preset at a level sufficient for persons with normal hearing. This poses an obvious disadvantage for persons having hearing impairments. It is also disadvantageous where the telephone is located in an environment with high ambient noise levels, such as manufacturing facilities.

One solution to this problem is to provide a telephone handset with a receiver amplifier and a volume control in the form of a potentiometer. The potentiometer allows the user to vary the receiver "volume" to suit the user's need. A receiver amplifier of this type is disclosed in U.S. Pat. No. 4,151,376. Other telephone handset amplifiers are also well known. For example, see U.S. Pat. Nos. 3,254,160 and 3,830,979.

Conventional telephone handsets almost universally employ the variable-resistance granular carbon-type transmitter. This type of transmitter responds poorly to low sound levels and has limited frequency response and appreciable distortion.

SUMMARY OF THE INVENTION

A telephone handset amplifier circuit for receiving and amplifying an audio signal from a telephone subset by varying amounts based on the duration of operation of a switch and for converting the amplified audio signal into audible sound. The amount of amplification is determined by a variable impedance element such as a FET. An RC circuit controls the impedance of the FET based on the state of the switch and the level of a supply voltage generated in the transmitter portion of the circuit. An electret condensor microphone regulates or stabilizes the supply voltage and provides improved linearity and low transmitter distortion.

An object of the invention is to provide a telephone handset amplifier which amplifies the audio signal received from the telephone subset by varying amounts dependent on the duration of operation of a manually operable switch.

Another object of the invention is to provide a telephone handset amplifier with a transmitter having improved linearity and distortion.

Other objects and advantages of the invention appear hereinafter.

BRIEF DESCRIPTION DRAWINGS

For the purpose of illustrating the invention, there is shown in the drawings a form which is presently preferred; it being understood, however, that this invention is not limited to the precise arrangements and instrumentalities shown.

FIG. 1 is a block diagram of the telephone handset amplifier circuit in accordance with the present invention.

FIG. 2 is a schematic showing the details of the transmitter portion of the circuit.

FIG. 5 is an exploded view of the switch and handset construction.

DETAILED DESCRIPTION OF THE INVENTION

Figure 3:
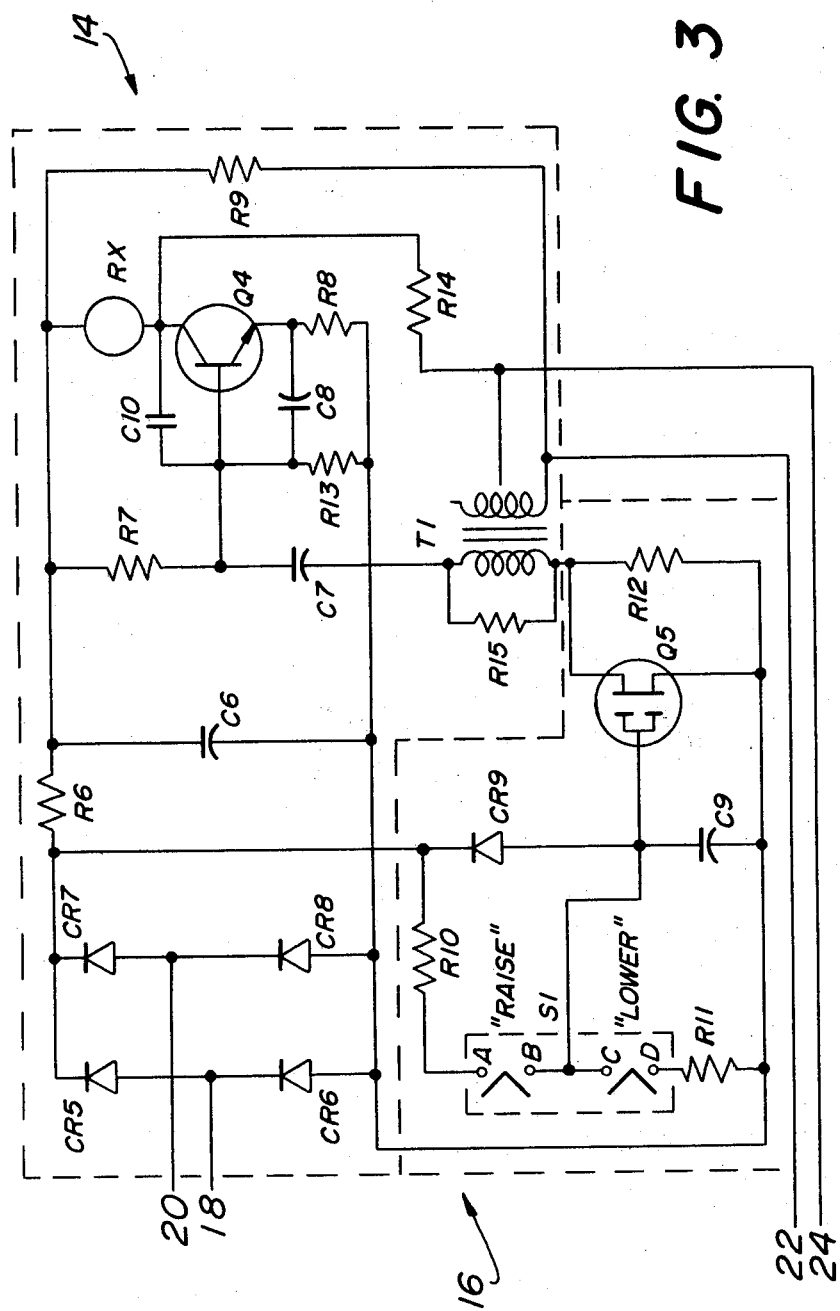
FIG. 3 is a schematic showing the details of the receiver portion and the volume control portion of the circuit.

The telephone handset amplifier circuit of the present invention is shown in block diagram form in FIG. 1. The circuit comprises three basic elements: (1) a transmitter circuit 12, (2) a receiver circuit 14, and (3) a receiver volume control circuit 16. The transmitter, receiver and volume control circuits are disposed on printed circuit boards in a telephone handset. See FIG. 5. A telephone subset 26 is connected by lines 18-24 to the handset circuits as shown in FIG. 1. The subset 26 comprises a conventional telephone circuit. As is well known, the transmit signal appears at the transmit lines 18-20 of the subset, and the receive signal is at the receive lines 22-24. Details of subset 26 are conventional and are not pertinent to the present invention.

Transmitter Circuit

Referring to FIG. 2, the transmitter circuit 12 comprises an electret condensor microphone MIC and a microphone amplifier comprising transistors Q1, Q2 and Q3 and associated circuit elements as shown. The electret condensor microphone MIC provides superior linearity and distortion performance and has a typical frequency response from 50 Hz to 15 KHz and distortion of approximately 1% at normal speech levels.

The transmitter circuit 12 supply voltage is obtained from subset 26 via wires 18 and 20 which are connected to the input of a rectifier bridge comprising diodes CR1-CR4. Diodes CR1CR4 are preferably the 1N914 type. The diode bridge renders the transmitter circuit 12 insensitive to reversal of voltage polarity on lines 18 and 20. Thus, it makes no difference whether the transmit wires 18 and 20 are connected as shown in FIG. 2 or are transposed, that is, connected in the opposite polarity. This facilitates connection of wires 18 and 20 to the handset. The microphone MIC is connected through a resistor R2 to the voltage supply output of the diode bridge CR1-CR4. The microphone is shunted by capacitor C1.

Microphone MIC produces an output voltage which varies in response to an acoustic input. The output of microphone MIC is ac coupled to the base of transistor Q1 by capacitor C3. A capacitor C2 coupled to the microphone output serves as a low pass filter. The transistor Q1 may be a 2N3391 transistor. The transistor is biased by resistors R1-R5. The transmitter signal generated at the collector of transistor Q1 is further amplified by transistors Q2 and Q3 which are connected in Darlington configuration.

In operation, in response to an acoustic input, microphone MIC produces an audio signal voltage which is ac coupled to the base of resistor Q1, amplified at the collector of transistor Q1 and applied to Darlington pair Q2 and Q3. The Darlington pair offers high input impedance to reduce the loading effect on transistor Q1. The current at the collector transistor Q3, then, varies in proportion to the audio signal produced by microphone MIC and is returned to the subset 26 via wires 18 and 20.

Receiver Amplifier and Volume Control

FIG. 3 shows the details of the receiver amplifier and volume control circuits. The supply voltage of the receiver amplifier circuit 14 is obtained from wires 18 and 20 via diode bridge CR5–CR8 in the same manner described previously in connection with the transmitter circuit supply voltage. Diodes CR5–CR8 are preferably the 1N60 type. The diode bridge CR5–CR8 renders the receiver amplifier circuit insensitive to voltage polarity i.e. transposition of wires 18 and 20. The receiver amplifier comprises transistor Q4, associated capacitors C7, C8 and C10, and resistors R7, R8 and R13. The receiver RX is a conventional permanent magnet diaphragm receiver and is connected in series with the collector of transistor Q4. Thus, the voltage across receiver RX is a function of the Q4 collector current.

The volume control 16 comprises rocker switch S1, capacitor C9, resistors R10–R12, and FET Q5. FET Q5 is preferably a metal oxide silicon (MOS) transistor such as an SD305. Capacitor C9 is preferably a tantalum capacitor. Rocker switch S1 is shown in the neutral position in FIG. 3 wherein terminal points A, B, C and D are opened.

Referring to the receiver amplifier circuit 14, a transformer T1 receives the audio input generated on lines 22 and 24 by subset 26. Resistors R9 and R14 are connected between the primary of transformer T1 and the receiver RX to "bleed" audio to the receiver RX while touch tones are being transmitted. The user may therefore hear the touch tones generated when dialing a number. Ordinarily, the voltage transmitted by subset 26 on lines 18 and 20 is dropped automatically during dialing. The supply voltage to transistor Q4, taken off bridge CR5–CR8, drops proportionately so that the transistor Q4 is essentially inoperative. The resistors R9 and R14 provide enough signal to the receiver RX to make the touch tones audible despite the essentially inoperative condition of transistor Q4.

In operation, an audio signal from subset 26 is transmitted to the primary of T1 via wires 22 and 24. The audio signal is ac coupled at the secondary of transformer T1 to the base of transistor Q4 by capacitor C7. The transformer secondary is shunted by resistor R15 to reduce the load on lines 22 and 24. FET Q5 is shunted across resistor R12, and the FET and resistor combination is connected in series with the resistor R15 and secondary of transformer T1. The signal at the base of transistor Q4 is therefore determined by the impedance of FET Q5.

The FET Q5 is a variable impedance element which is controlled at its gate. The impedance of FET Q5 is varied by changing the voltage on capacitor C9 which is connected to the FET gate. Capacitor C9 is also connected to the center tap of rocker switch S1. Selective operation of the rocker switch by the user enables the capacitor C9 to (1) charge through resistor R10 to the supply voltage generated by bridge CR5CR8 or (2) discharge through resistor R11.

When switch S1 is depressed and maintained in the "RAISE" position, the switch shorts terminal points A and B and connects capacitor C9 to the supply voltage generated by bridge CR5–CR8 through resistor R10. Terminal points C and D remain opened. This provides a charging path for capacitor C9, and the capacitor charges towards the bridge supply voltage. The charging rate is determined by the capacitor C9 and resistor R10 as long as the rocker switch S1 is in the raised position. As the capacitor C9 charges, the FET gate voltage increases. As a result, the impedance of the FET decreases, thereby increasing the amplitude of the audio input at the base of transistor Q4. The transistor collector current increases proportionately.

As the collector current increases, the acoustic signal produced by receiver RX also increases. The handset user notices this as an increase in receiver "volume". When the desired receiver "volume" is reached, the handset user releases switch S1 from the "RAISE" position whereby the switch returns to the neutral position shown in FIG. 3. The handset thereafter operates at the desired receiver "volume".

To reduce the receiver "volume", switch S1 is depressed and maintained in the "LOWER" position. When switch S1 is in the "LOWER" position, the switch shorts terminal points C and D and capacitor C9 discharges via the resistor R11. Terminal points A and B remain open. The rate of discharge is determined by the capacitor C9 and resistor R11 as long as the rocker switch S1 is in the "LOWER" position. As the capacitor discharges, the voltage at the FET gate decreases resulting in an increase in the FET impedance. As a result, the audio input to transistor Q4 decreases, and the transistor collector current decreases proportionately. The accoustic signal produced by receiver RX therefore decreases. The handset user notices this as a decrease in receiver "volume". To hold the desired receiver "volume", the handset user releases switch S1 from the "LOWER" position whereby the switch returns to the neutral position shown in FIG. 3.

By merely depressing switch S1, the voltage across capacitor C9 is made to automatically and continuously vary between common and the supply voltage generated by bridge CR5–CR8. Thus, the receiver "volume" is automatically and continuously variable at a rate and within a range defined by the RC circuits C9–R10 or C9–R11.

Automatic Reset

A diode CR9 is connected from the gate of FET Q5 to the output of bridge CR5-CR8. The diode is backbiased when the handset is off the subset cradle. When the handset is replaced in the telephone subset cradle, however, capacitor C9 rapidly discharges through the diode. When the handset is placed in the cradle, the input voltage to the bridge, on lines 18 and 20, is automatically removed by the subset 26. As a result, diode CR9 is forward biased by the residual capacitor C9 voltage, and the capacitor rapidly discharges through the diode to reset the FET to the high impedance state. Accordingly, the receiver "volume" is automatically reset to a minimal level determined by resistor R12 which shunts the source and drain of the FET. The subsequent user of the handset, then, will not be disturbed by the "volume" setting of the prior user.

Electret Condensor Microphone

In the preferred embodiment, a voltage greater than approximately one volt at the gate of FET Q5 causes the FET to start to conduct (decreasing impedance) with an attendant increase in receiver "volume". Maximal receiver "volume" is achieved with a gate voltage of approximately three volts.

The requirement of a FET gate voltage of approximately three volts for maximal receiver "volume" creates a problem if a conventional carbon transmitter is used. This is because the transmitter circuit 12, receiver circuit 14 and volume control circuit 16 obtain supply voltage from the same subset lines 18 and 20. The voltage across a carbon transmitter may vary between two-six volts, depending on how the carbon granules are shaken. The fluctuation in the load presented by the carbon transmitter will be reflected through bridge CR5–CR8 as a fluctuation in the voltage across lines 18, 20. As a result, the supply voltage at the output of bridge CR1–CR4 shifts, producing a shift in receiver "volume" and degraded operation of the receiver amplifier.

In contrast, the electret condensor microphone MIC provides a regulated average voltage of approximately four volts across its terminals so that the load on lines 18, 20 is relatively stable. As a result, the shift in receiver "volume" is avoided while providing superior linearity and distortion performance.

The invention permits rapid, automatic and continuous receiver "volume" control to suit the specific needs of the handset user. Preferably, all circuit components are disposed within the telephone handset and the rocker switch S1 is mounted on the handset itself. Receiver "volume" control is attained by mere depresion and release of the rocker switch, a manual function which can be easily performed by the same hand which grasps the handset.

Handset Construction

Figure 4:
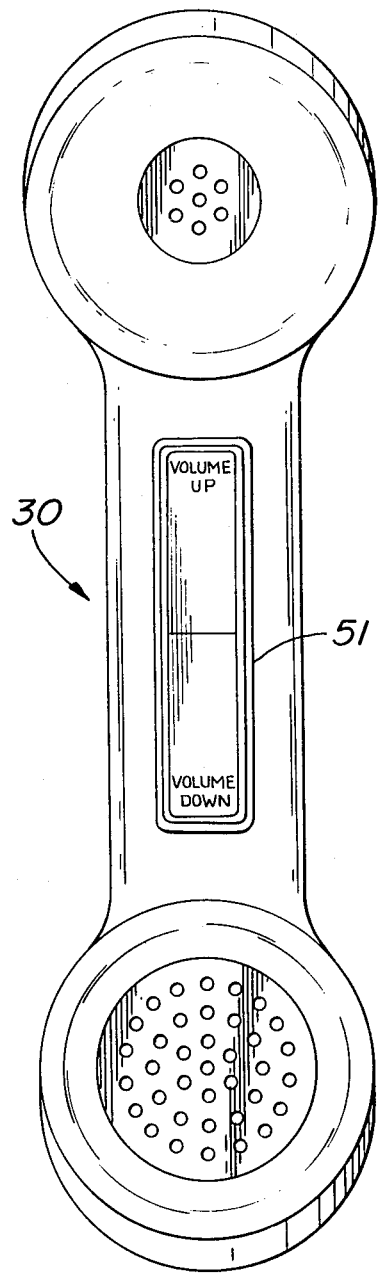
FIG. 4 is a view of the handset exterior showing the fingerbar.
Figure 6:
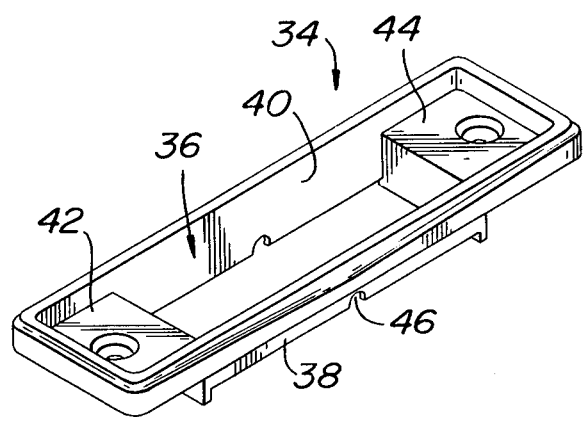
FIG. 6 is a perspective of the switch frame.
Figure 7:
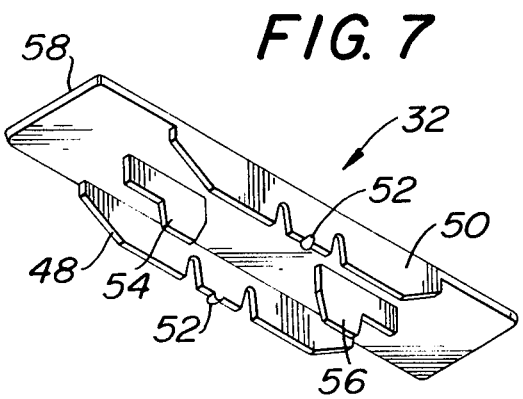
FIG. 7 is a perspective of the fingerbar.

A handset 30 adapted to accommodate the handset amplifier circuit of the present invention is shown in FIG. 4. The rocker switch S1 is mounted in the central portion of the handset to facilitate operation by the user.

Details of the rocker switch S1 construction are shown in FIGS. 4–7. The rocker switch S1 comprises a fingerbar 32 and switch frame 34. The switch frame 34 is provided with a well 36 having an open bottom. See FIG. 6. The well 36 is defined by facing walls 38 and 40 and facing shoulders 42 and 44. Each wall 38, 40 is provided with a semi-circular cut-out 46.

The fingerbar 32 is provided with spaced ribs 48 and 50. See FIG. 7. A short pin 52 is provided at the central portion of each rib 48, 50 and projects outwardly of each rib. A pair of switch fingers 54 and 56 are disposed intermediate ribs 48 and 50 and are spaced along the longitudinal axis of the fingerbar 32 on each side of the transverse axis defined by pins 52. The switch fingers 54, 56 depend from the underside of the operator accessible portion 58 of the fingerbar and extend below the lower edges of the ribs 48 and 50.

The switch fingers 54 and 56 are juxtaposed with a pair of switch pads (not shown) which include the terminal points A and B and terminal points C and D respectively (FIG. 1). The switch pads are mounted on a printed circuit board 60 (FIG. 5). When the "VOLUME UP" section of the operator accessible portion 58 of the fingerbar is depressed, the switch finger 56 contacts the associated switch pad on printed circuit board 60 to couple the terminal points A and B (FIG. 3). When the "VOLUME DOWN" section of the operator accessible portion 58 of the fingerbar is depressed, the switch finger 54 contacts the associated switch pad on the printed circuit board to couple the terminal points C and D.

To assemble and mount the switch S1 on the handset, the switch frame 34 is seated on shoulders 62, 64 of the handset well 66. See FIG. 5. The switch frame shoulders 42 and 44 are provided with openings 68 and 70 through which screws 72 and 74 are inserted to fasten the switch frame to the handset. Screws 72 and 74 are secured in threaded recesses 76 and 78 in the handset.

The fingerbar 32 is seated on the switch frame shoulders 42 and 44 such that the fingerbar pins 52 nest in the semi-circular cut-outs 46. Depression of the "VOLUME UP" or "VOLUME DOWN" section of the fingerbar 32 results in a rocking motion of the fingerbar about the transverse axis defined by the pins 52. Depending on which section of the fingerbar has been depressed, the switch finger 54 or switch finger 56 contacts the associated switch pad on printed circuit board 60 to close the terminal points A and B or the terminal points C and D.

The volume control circuit 16 is mounted on the printed circuit board 60. The printed circuit board is seated on shoulders 80 and 82 in the handset well 66 below switch frame 34.

The electret condensor microphone MIC is seated in the transmitter cup 84. A printed circuit board 86 bearing the transmitter circuit 12 is mounted on the microphone. A printed circuit board 90 bearing the receiver amplifier circuit 14 is mounted in the handset proximal the receiver cup 88 within which the receiver RX is located.

The present invention may be embodied in other specific forms without departing from the spirit or essential attributes thereof and, accordingly, reference should be made to the appended claims, rather than to the foregoing specification, as indicating the scope of the invention.

We claim:

1. Telephone signal amplifier, comprising:
    an operator accessible switch is operable in at least two states,
    means coupled to said operator accessible switch for receiving an audio signal generated by a telephone network and for reducing the level of said telephone network audio signal over a range of levels based on the duration of operation of said switch in either of said states,
    an amplifier having in input side coupled to said means for reducing the level of said telephone network audio signal for amplifying the reduced level audio signal, and
    a telephdne receiver coupled to the output side of said amplifier for transducing an audio signal to sound.

2. Telephone signal amplifier according to claim 1 wherein said means for reducing the level of said telephone network audio signal is ac coupled to the input side of said amplifier.

3. Telephone signal amplifier according to claim 2 wherein said means for reducing the level of said telephone network audio signal comprises a FET.

4. Telephone signal amplifier according to claim 1 including means adapted to be coupled to a telephone network for providing power to said means for reducing the level of said telephone network audio signal, and means actuable by the removal of said power for resetting said means for reducing the level of said telephone network audio signal.

5. Telephone signal amplifier according to claim 4 wherein said means for resetting comprises a diode.

6. Telephone signal amplifier according to claim 1 including means coupled to the output side of said amplifier for conducting a Touch-Tone signal generated by said telephone network to the receiver when the amplifier is disabled.

7. Telephone signal amplifier according to claim 1 wherein said operator accessible switch comprises a fingerbar which is pivotable from a neutral position that corresponds to an inoperable state of the switch to either of at least two positions that correspond to said operable states of the switch.

8. Telephone signal amplifier according to claim 3 including first power means adapted to be coupled to said telephone network for providing power to said means for reducing the level of said audio signal, an electret condenser microphone for transducing sound into an audio signal, and second power means adapted to be coupled to said supply lines of said telephone network for providing power to said electret condenser microphone.

9. Telephone signal amplifier, comprising:
a telephone handset having a receiver cup and transmitter cup separated by a handle portion,
an operator accessible switch mounted on the handset handle portion, said switch being operable in a least two states,
means disposed within the handset and coupled to said operator accessible switch for amplifying an audio signal generated by a telephone network based on the duration of operation of said switch to either of said states, said means for amplifying said sudio signal comprising an amplifier and FET means ac coupled to the input side of said amplifier for reducing the level of said telephone network audio signal over a range of levels based on the duration of operation of said switch, and
a receiver disposed within the receiver cup for transducing the amplified audio signal to sound.

10. Telephone signal amplifier according to claim 9 including means adapted to be coupled to said telephone network for providing power to said means for amplifying said telephone network audio signal, and means actuable by the removal of said power for resetting said means for amplifying said telephone network audio signal.

11. Telephone signal amplifier according to claim 10 wherein said means for resetting comprises a diode.

12. Telephone signal amplifier according to claim 9 including means coupled to said means for amplifying said sudio signal for conducting a Touch-Tone signal generated by a telephone network to said receiver when said means for amplifying is disabled.

13. Telephone signal amplifier according to claim 9 wherein said operator accessible switch comprises a fingerbar which is pivotable from a neutral position that corresponds to an inoperable state of the switch to either of at least two positions that correspond to said operable states of the switch.

14. Telephone signal amplifier according to claim 9 including first power means adapted to be coupled to a telephone network for providing power to said means for amplifying said level of said audio signal, an electret condenser microphone for transducing sound into an audio signal, and second power means adapted to be coupled to said telephone network for providing power to said electret condenser microphone.

* * * * *